(12) United States Patent
Dean et al.

(10) Patent No.: US 6,791,325 B1
(45) Date of Patent: Sep. 14, 2004

(54) IMPEDANCE MISMATCH APPARATUS AND SYSTEM FOR ISOLATION OF AN MR IMAGING SYSTEM

(75) Inventors: David Edwards Dean, Hartland, WI (US); Mike James Radziun, Waterford, WI (US); Scott Thomas Mansell, Waterford, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/250,015

(22) Filed: May 28, 2003

(51) Int. Cl.[7] .................................................. G01V 3/00
(52) U.S. Cl. ...................................... 324/318; 324/322
(58) Field of Search ................................ 324/318, 322, 324/300, 306, 307, 309, 314

(56) References Cited

U.S. PATENT DOCUMENTS

| | | | | |
|---|---|---|---|---|
| 3,823,470 A | * | 7/1974 | Albsmeier et al. ............ | 29/593 |
| 5,256,969 A | * | 10/1993 | Miyajima et al. ............ | 324/318 |
| 6,084,409 A | * | 7/2000 | Zebelein et al. ............ | 324/318 |
| 6,160,399 A | | 12/2000 | Radziun et al. | |
| 6,375,147 B1 | | 4/2002 | Radziun et al. | |

* cited by examiner

*Primary Examiner*—Louis Arana
(74) *Attorney, Agent, or Firm*—Michael Della Penna

(57) ABSTRACT

An MR system isolation impedance mismatch apparatus (12) includes an impedance mismatch layer (24). The impedance mismatch layer (24) performs as a mechanical notch filter and isolates an MR system component (14) from a surrounding structure (18). A method of tuning the impedance mismatch apparatus (12) includes determining a default notch filter frequency range. The impedance mismatch apparatus (12) is formed and performs as a notch filter having the default notch filter frequency range. The impedance mismatch apparatus (12) is installed and tested between the MR system component (14) and the surrounding structure (18). Vibrations are detected in the MR system component (14) and in the surrounding structure (18). The impedance mismatch apparatus is adjusted in response to the detected vibrations.

20 Claims, 4 Drawing Sheets

IMPEDANCE MISMATCH APPARATUS AND SYSTEM FOR ISOLATION OF AN MR IMAGING SYSTEM

BACKGROUND OF INVENTION

The present invention relates generally to magnetic resonance (MR) imaging systems, and more particularly, to an apparatus and system for isolating mechanical vibrational disturbances between an MR imaging system and a surrounding structure and to a method of tuning the apparatus.

Magnetic resonance imagers employ electrically excited coils to impose time varying magnetic field current on a larger but steady primary field provided by a main magnet. The imposed currents exist within a magnetic field causing generation of corresponding forces on conductors contained therein. The corresponding forces result in generation of undesirable dynamic motions of the conductors that propagate throughout the magnetic resonance imager.

The dynamic motions of the conductors have associated waveforms that contain repetitive pulses with fast transitions. The waveforms impart vibrational energy within an audio frequency range and in turn radiate sound pressure waves at solid to air interfaces resulting in pronounced acoustic noise. The generated vibrations transmit through a cryostat of the magnetic resonance imaging system into a building structure, such as a floor, a wall, or other structure within a building environment. Upon being transferred into the building structure the vibrations may then propagate throughout a building site where they can emerge as noise sources in various areas of the building. The generated acoustical noise can cause irritation and interference with clinical procedures, such as for example listening for irregularities in a patient's heart. In addition, high-speed scans in high field magnets can generate increased noise levels that are beyond acceptable exposure levels.

Although, a cryostat is typically rigidly fixed to a building structure several classical isolation methods have been attempted for isolation of the cryostat. The prior attempts have included use of coil springs, air shocks, and soft elastomeric isolation material pads in order to attenuate the vibrations and thus the acoustical noise. The isolation pads are typically formed of a solid elastomer. However, the classical isolation methods, due to their design of allowing the cryostat to freely displace without transferring vibration from the cryostat into a building structure, often lead to risk of increased rigid body motion of the cryostat, which has an adverse effect on image quality. Classical isolation methods use soft compliant materials that allow for a large amount of displacement.

It is desirable that a cryostat exhibit minimal rigid body motion generated from surrounding building structures. Building structures typically have a low resonating mechanical frequency or vibration that can transfer through solid compliant elastomeric pads or the like into a cryostat and amplify existing cryostat vibrations, which can result in poor image quality, and potentially render an MR imaging system ineffective in performing image reconstruction.

Use of soft elastomeric pads also adds risk to long-term performance due to slow changes in material properties therein over time also resulting in poor image quality. Over time the pads need to be replaced and the MR imaging system may need to be recalibrated, which is costly due to machine downtime, labor costs, and part replacement costs.

Moreover, there is a continuous need to update existing imaging systems. When updating an existing system various parameters may be altered or adjusted causing the resulting imaging system to generate a different set of vibrational frequencies then originally generated. Current isolation techniques do not account for system updates and imaging system and building structural responses generated therefrom.

It would therefore be desirable to provide a system or method of isolating a cryostat from a building structure that minimizes transfer of cryostat generated vibrations to proximate building structures, that exhibits minimal risk of long-term performance, that minimizes transfer of rigid body motion from a building structure, and accounts for system updates.

SUMMARY OF INVENTION

The present invention provides an apparatus and system for isolating mechanical vibrational disturbances between an MR imaging system and a surrounding structure. An MR system isolation impedance mismatch apparatus is provided that includes an impedance mismatch layer. The impedance mismatch layer performs as a mechanical notch filter and isolates an MR system component from a surrounding structure.

A method of tuning the impedance mismatch apparatus is also provided that includes determining a default notch filter frequency range. The impedance mismatch apparatus is formed and performs as a notch filter having the default notch filter frequency range. The impedance mismatch apparatus is installed and tested between the MR system component and the surrounding structure. Vibrations are detected in the MR system component and in the surrounding structure. The impedance mismatch apparatus is adjusted in response to the detected vibrations.

One of several advantages of the present invention is that it provides an impedance mismatch between an MR system component and a building structure. In so doing the present invention attenuates vibrational and acoustical noise generated from the MR system component and prevents amplification of vibrational energy contained within a building structure, thus preventing transfer of vibrational energy between the MR system component and the building structure. The present invention in minimizing transfer of vibrational energy between MR system components and building structures improves image quality and nearby working environments.

Another advantage of the present invention is that it utilizes relatively rigid materials that exhibit minimal long-term performance variations.

Furthermore, the present invention accounts for updates to an MR system by providing a method of tuning the impedance mismatch apparatus to adjust for the updates with minimal downtime and costs involved therein.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1A:
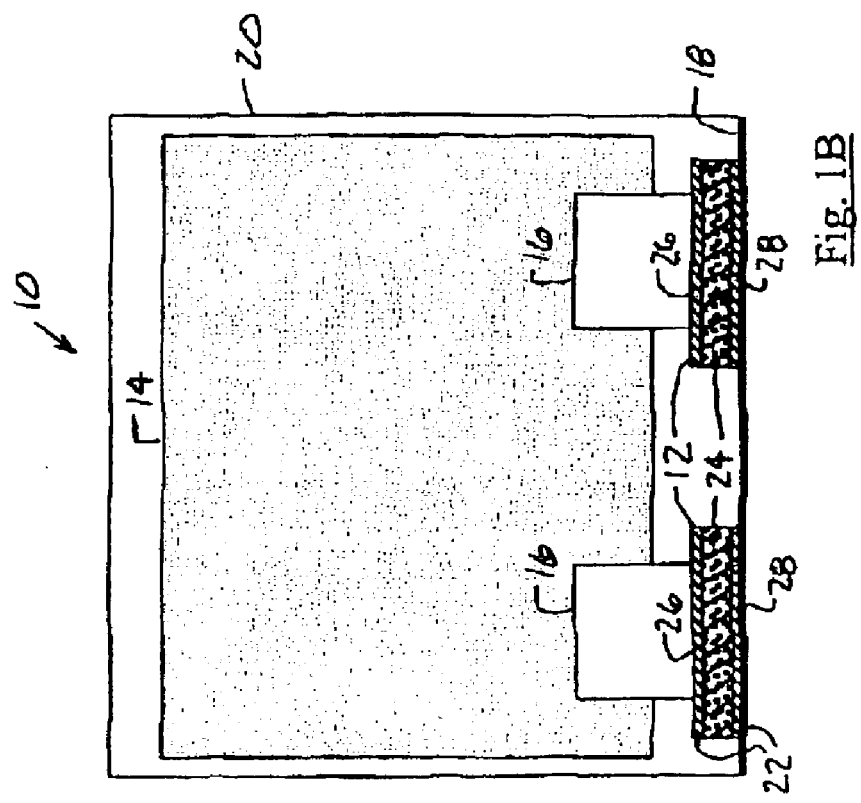
FIG. 1A is a front view of a magnetic resonance (MR) imaging system utilizing an MR system isolation impedance mismatch apparatus in accordance with an embodiment of the present invention.

To better describe the utility and purpose of the present invention, two main principles of concern are described in detail below. The first and primary principle is the idea and associated phenomenon of "matched impedance" where net transmission of power is maximized. For example, when a support structure has an impedance that matches or is approximately equal to that of an imaging system, vibrational disturbances may easily pass from the support structure to the imaging system resulting in poor image quality and from the imaging system to the support structure resulting in excessive acoustical noise. The present invention solves this problem by providing an impedance mismatch between imaging system components and surrounding structures, such as between a cryostat and a supporting floor. As impedance between two objects becomes more and more mismatched power transfer, in either direction, is therebetween reduced.

The above-stated phenomenon for mechanical disturbances can be described and understood as the manner as to which a wavefront travels within a solid assembly and tends to split at each mechanical discontinuity, such as joints between different solid elements. A propagating wavefront transforms into a transmitted component, beyond the discontinuity, and a reflected component, which returns along an original path but in an opposite direction. When there is a small amount of mechanical discontinuity, such as a single solid element, a perfect match in impedance exists, thus allowing maximum power to be transmitted due to lack of or no reflection in the wavefront. Conversely, a free end of a solid element in a fluid, such as air, tends to reflect most input waves since there is minimal mechanical mechanisms or a large impedance mismatch for wave transmission between the solid element and the fluid.

The present invention provides a large impedance mismatch between a magnetic resonance (MR) system component and a surrounding structure without reliance on an interface composed of a highly compliant material, as in the prior art, allowing the present invention to avoid the above-stated problems. Although the present invention is formed using preferably less compliant materials, compliant materials may be employed to enhance a second but less important principal of power dissipation. In general compliant materials have higher loss factors than stiff materials and therefore provide higher attenuation. As is further described below the present invention provides desired attenuation using less compliant materials. Power dissipation is desirable, such that mechanical vibrations are attenuated. It is desirable to dissipate as much vibrational energy as possible within a space allotted as long as mechanisms employed to dissipate the energy do not detract from the primary principle of impedance mismatch and do not cause increased rigid body motion, as in classical isolation schemes.

The present invention reduces energy in both the transmitted and reflected waves. In satisfying the stated principals and restrictions the present invention as described below reduces transmission of mechanical vibrations between MR system components and surrounding structures without degradation to image quality from motion of MR system components and without loss of attenuation performance over long time periods.

In the following figures the same reference numerals will be used to refer to the same components. While the present invention is described with respect to an apparatus and system for isolating mechanical vibrational disturbances between an MR imaging system and a surrounding structure and to a method of tuning the apparatus, the following apparatus, system, and method is capable of being adapted for various purposes and is not limited to the following applications: magnetic resonance imaging (MRI) systems, CT systems, radiotherapy systems, x-ray imaging systems, ultrasound systems, nuclear imaging systems, magnetic resonance spectroscopy systems, and other applications known in the art.

In the following description, various operating parameters and components are described for one constructed embodiment. These specific parameters and components are included as examples and are not meant to be limiting.

Also, in the following description the term "MR system component" refers to any MR system component, including a cryostat, a system housing or support structure, a system magnet, or other system component known in the art. The following description, although primarily referring to mechanical vibration generated by a cryostat is by no means application or component limited to a cryostat.

Additionally, the term "surrounding structure" refers to any structure proximate to, in contact with, or surrounding an MR imaging system for which there is a potential for mechanical vibrational transfer thereto. A surrounding structure may refer to a building wall, floor, ductwork, piping, or other surrounding structure known in the art.

Figure 1B:
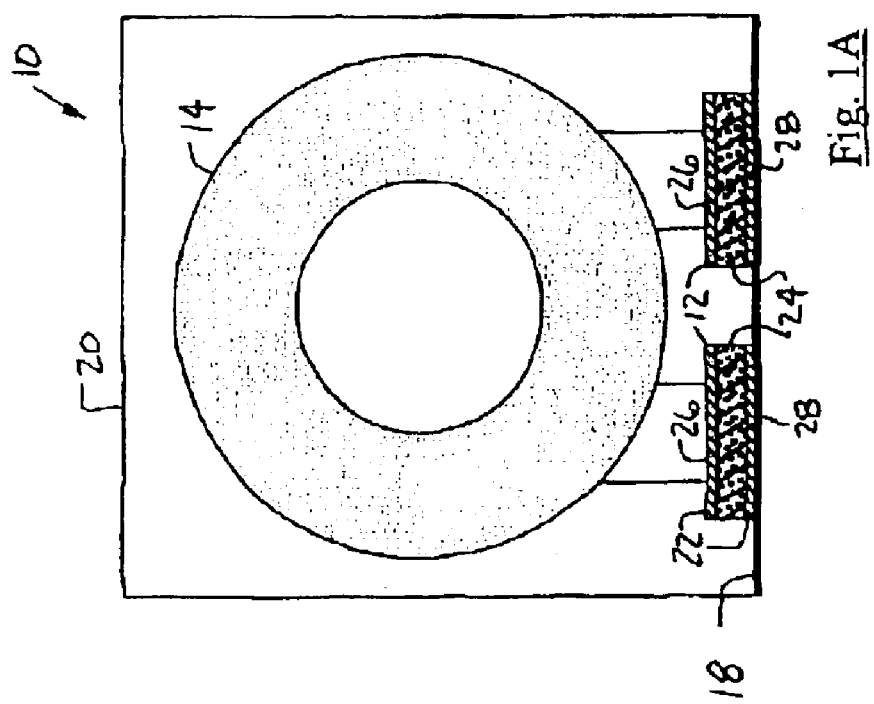
FIG. 1B is a side view of the MR imaging system utilizing the MR system isolation impedance mismatch apparatus in accordance with an embodiment of the present invention.

Referring now to FIGS. 1A and 1B, front and side views of a MR imaging system 10 utilizing an MR system isolation impedance mismatch apparatuses 12 in accordance with an embodiment of the present invention are shown. The MR imaging system 10 includes a cryostat 14 that has support legs 16. The support legs 16 are mounted on the impedance mismatch apparatuses 12 and fastened to a surrounding structure or floor 18 of a building room 20. The support legs 16 may be fastened or adhered to the impedance mismatch apparatuses 12 using various methods known in the art. The impedance mismatch apparatuses 12 separate the cryostat 14 from the floor 18 and attenuate mechanical vibrations generated therefrom and prevent mechanical vibrational transfer therebetween.

The impedance mismatch apparatuses 12 include one or more plates 22 and one or more impedance mismatch layers 24. The layers 22 and 24 may be stacked, as shown, interlaced, or coexist in other various forms known in the art. Each of the layers 22 and 24 may also contain additional layers. In the embodiment of FIGS. 1A–2B, the impedance mismatch layers 24 are coupled between the plates 22; for each leg 16 a first plate 26 is coupled between the leg 16 and the impedance mismatch layer 24 and a second plate 28 is coupled between the impedance mismatch layer 24 and the floor 18. The impedance mismatch layers 24 perform as mechanical notch filters and isolate the cryostat 14 from one or more surrounding structures, such as the floor 18. Each impedance mismatch layer 24 by performing as a notch filter attenuates mechanical and acoustical frequencies within a predetermined frequency range.

The impedance mismatch layers 24 are preferably, but although not necessarily, formed of a different material, have a different geometrical material pattern, and a different material configuration than that of components or structures adjacent to, in contact with, and directly coupled thereto, such as the plates 22. In so doing, the present invention provides a high impedance mismatch between the cryostat 14 and the floor 18. In the embodiment shown, the plates 22 are formed of a metallic material, such as steel, and the impedance mismatch layers 24 are formed of an elastomeric material, such as rubber. The plates 22 have a different geometrical material pattern than the impedance mismatch layers 24 due to the different materials and material configurations contained therein. In an embodiment of the present invention, the plates 22 are in a solid sheet configuration whereas the impedance mismatch layers 24 are in a hexagonal configuration, as best seen in FIG. 2A.

The plates 22 may be formed of various materials including metal, plastic, ceramic, porcelain, or other rigid materials known in the art, which do not disturb a main magnet field beyond allowable limits.

The impedance mismatch layers 24 are relatively stiff and may be formed of various open, partially open, or closed cell elastomeric materials, as well as other compliant materials known in the art. The impedance mismatch layers 24 have a stiffness that is preferably greater than approximately 10,000 to 30,000 lbs. per square inch as compared to prior art compliant devices that have a stiffness rating of less than 10,000 to 30,000 lbs per square inch. The impedance mismatch layers 24 may be formed of a weave of various materials. In one embodiment of the present invention the impedance mismatch layers 24 are formed of neoprene.

Figure 2A:
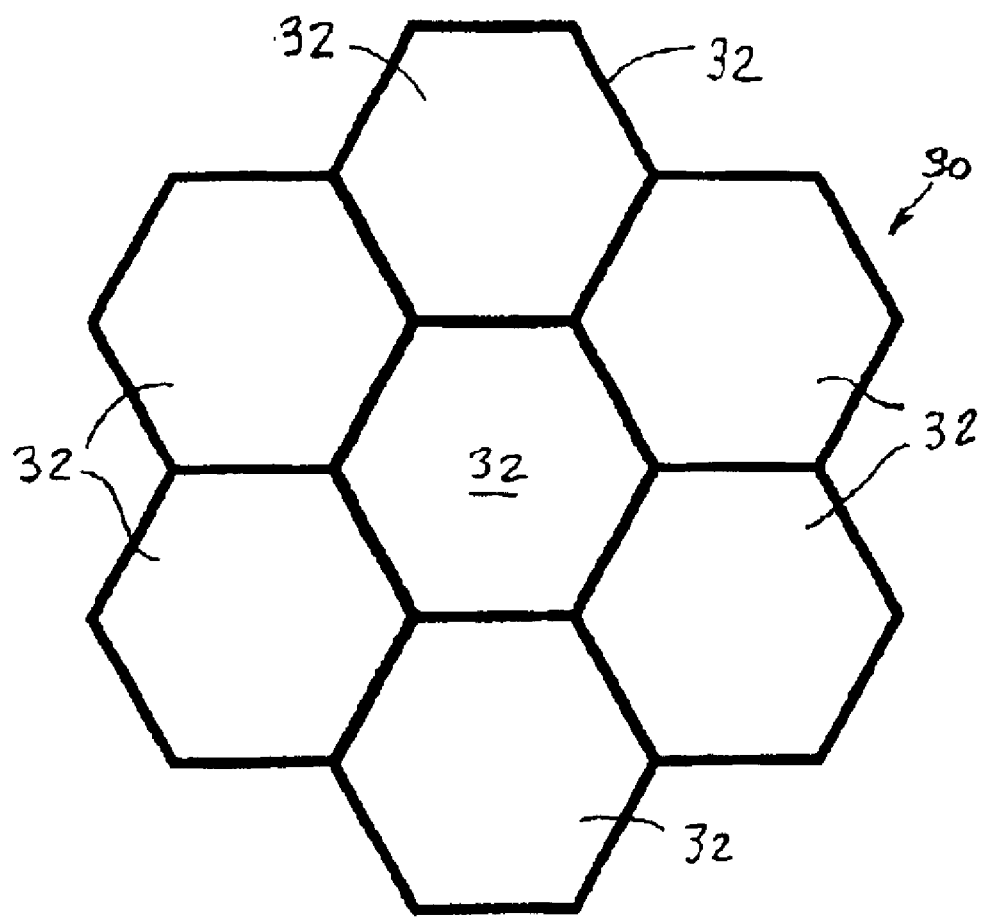
FIG. 2A is a top view of a sample portion of an impedance mismatch layer in accordance with an embodiment of the present invention.
Figure 2B:
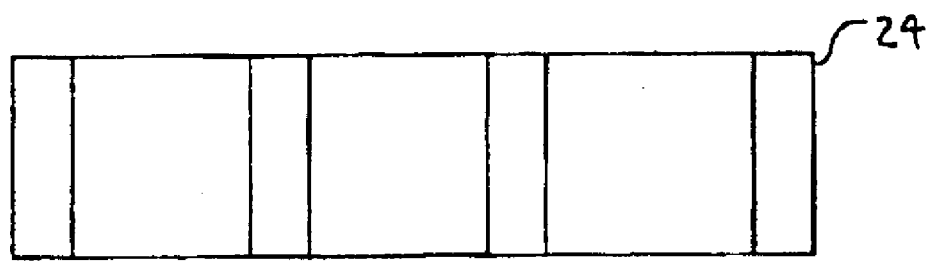
FIG. 2B is a side view of the sample portion of an impedance mismatch layer in accordance with an embodiment of the present invention.

Referring not to FIGS. 2A and 2B, top and side views of a sample portion of the impedance mismatch layers 24 in accordance with an embodiment of the present invention are shown. The impedance mismatch layers 24 may be of various size, shape, and have various material patterns contained therein. In one embodiment of the present invention the impedance mismatch layers 24 have a thin walled hexagonally shaped pattern 30, as shown. The hexagonally shaped pattern 30 includes multiple apertures 32, providing additional impedance mismatch between the plates 22.

Figure 3:
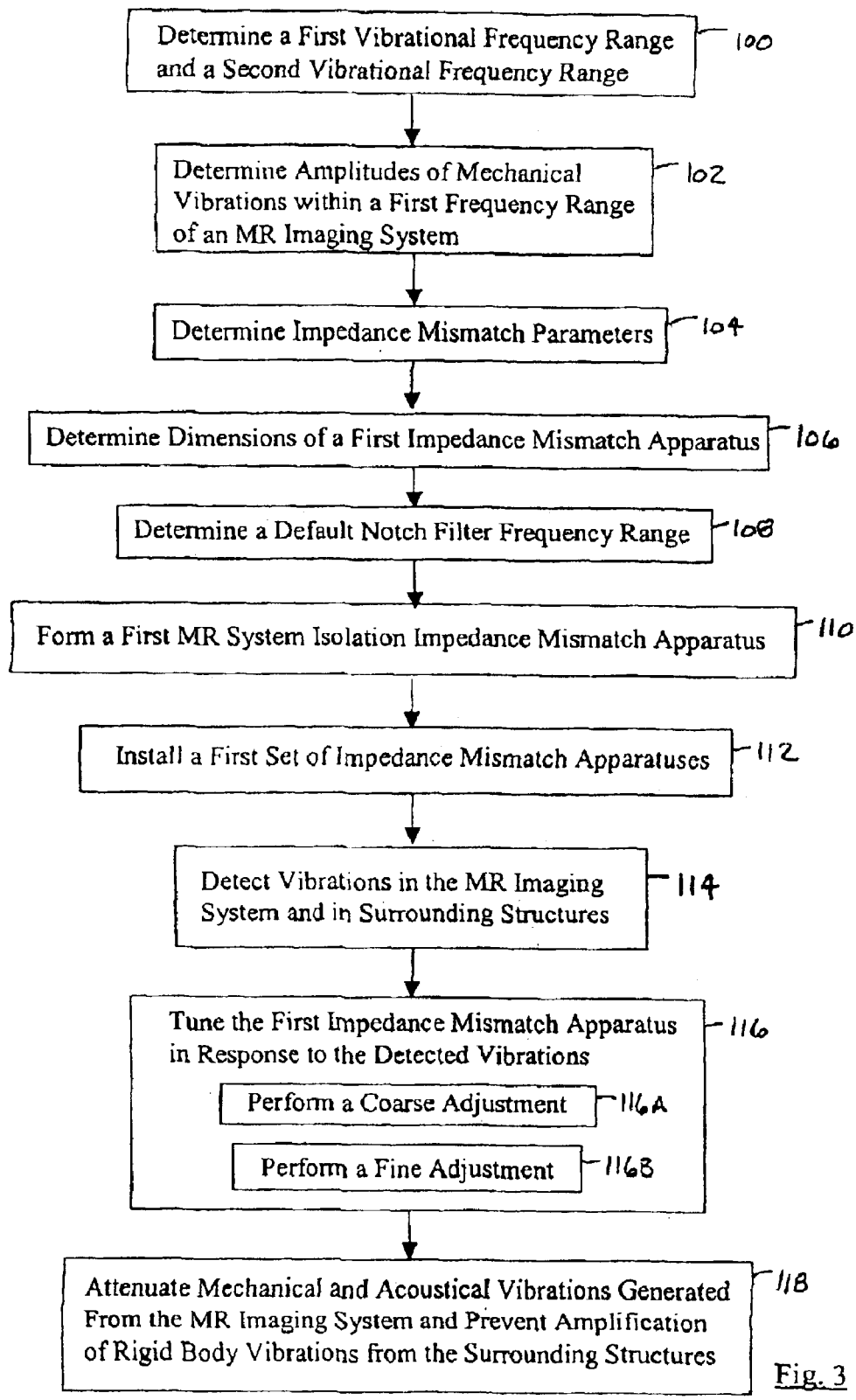
FIG. 3 is a logic flow diagram illustrating a method of tuning an MR system isolation impedance mismatch apparatus in accordance with an embodiment of the present invention.

Referring now to FIG. 3, a logic flow diagram illustrating a method of tuning the impedance mismatch apparatuses 12 in accordance with an embodiment of the present invention is shown.

In step 100, a first vibrational frequency range is determined, corresponding to vibrations generated by an MR system component, such as the cryostat 14, and a second vibrational frequency range is determined corresponding to vibrations generated by or contained within surrounding structures, such as the floor 18. The first vibrational frequency range and the second vibrational frequency range may be determined using prior collected data or may be determined using techniques including sensors and signal analyzers that are known in the art.

In step 102, amplitudes of mechanical vibrations within the first frequency range are determined. The amplitudes correspond to amounts of attenuation desired, which are used below to determine material and pattern makeup of the impedance mismatch layers 24. In step 104, impedance mismatch apparatus parameters are determined including gross weight and dimensions of an MR system component(s), dimensions of available space allotted for the MR system component(s), and other impedance mismatch apparatus parameters known in the art. Continuing from the same example, gross weight of the cryostat 14 and overall dimensions of the MR system 10 and of the room 20 are determined. In step 106, in response to the determined amplitudes, gross weight, system dimensions, and room dimensions initial dimensions of the impedance mismatch apparatuses 12 are determined.

In step 108, a default notch filter frequency range is determined. The default notch filter frequency range is determined in response to the first vibrational frequency range and the second vibrational frequency range. The default notch filter frequency range is determined to be within the first vibrational frequency range but at a higher end of the second vibrational frequency range. In so doing, the present invention attenuates gradient noise from the cryostat 14 or mechanical vibrations having frequencies within the first frequency range and does not amplify rigid body motions within the floor 18 or motions having frequencies within the second frequency range. Each of the above vibrational frequency ranges may be of various size; the vibrational frequency ranges may include only a single frequency or may be infinitely large, thus the ranges may include any number of frequencies.

For example and explanation purposes, continuing using the above-described embodiment, the cryostat 14 may have a gradient generated first vibrational frequency range of approximately between 5–20 KHz and the floor 18 may have a rigid body second vibrational frequency range of approximately 6–50 Hz. The cryostat 14 when combined with the impedance mismatch apparatuses 12 may have a combined resonating frequency of approximately 45 Hz. The default notch filter frequency range is determined to be centered about and to attenuate the 45 Hz combined resonating frequency.

In step 110, a first set of MR system isolation impedance mismatch apparatuses are formed to perform as notch filters having the default notch filter frequency range. The first impedance mismatch apparatuses, such as apparatuses 12 have a first set of plates and a first set of impedance mismatch layers, such as layers 22 and 24. Materials, material patterns, and material configurations are determined in response to the desired amount of attenuation, the dimensions of the apparatuses 12, and the default notch filter frequency range. Impedance mismatch between the layers 22 and 24 is increased for increased attenuation performance.

In step 112, the first impedance mismatch apparatuses 12 are installed and tested between the cryostat 14 and the floor 18.

In step 114, vibrations are detected in the MR system 10 and in the surrounding structures, such as the floor 18, using methods known in the art.

In step 116, the first impedance mismatch apparatuses 12 are adjusted or tuned in response to the detected vibrations. The detected vibrations may exist due to changes at an existing site, site variations, new system updates, or due to other site or system parameters variations known in the art. The first impedance mismatch apparatuses 12 may be tuned using a coarse adjustment or a fine adjustment.

In step 116A, when a coarse adjustment is performed, the first impedance mismatch apparatuses 12 or the first set of impedance mismatch layers 24, replaced with a second MR system isolation impedance mismatch apparatus or a second set of impedance mismatch layers, similar to the first apparatuses 12 and the first layers 24, but having a notch filter frequency range that is largely different than that of the first impedance mismatch apparatuses 12. For example, the first impedance mismatch layers 24 may have a hardness rating of "50" and be replaced with less stiff layers having a hardness rating of "70".

Figure 4:
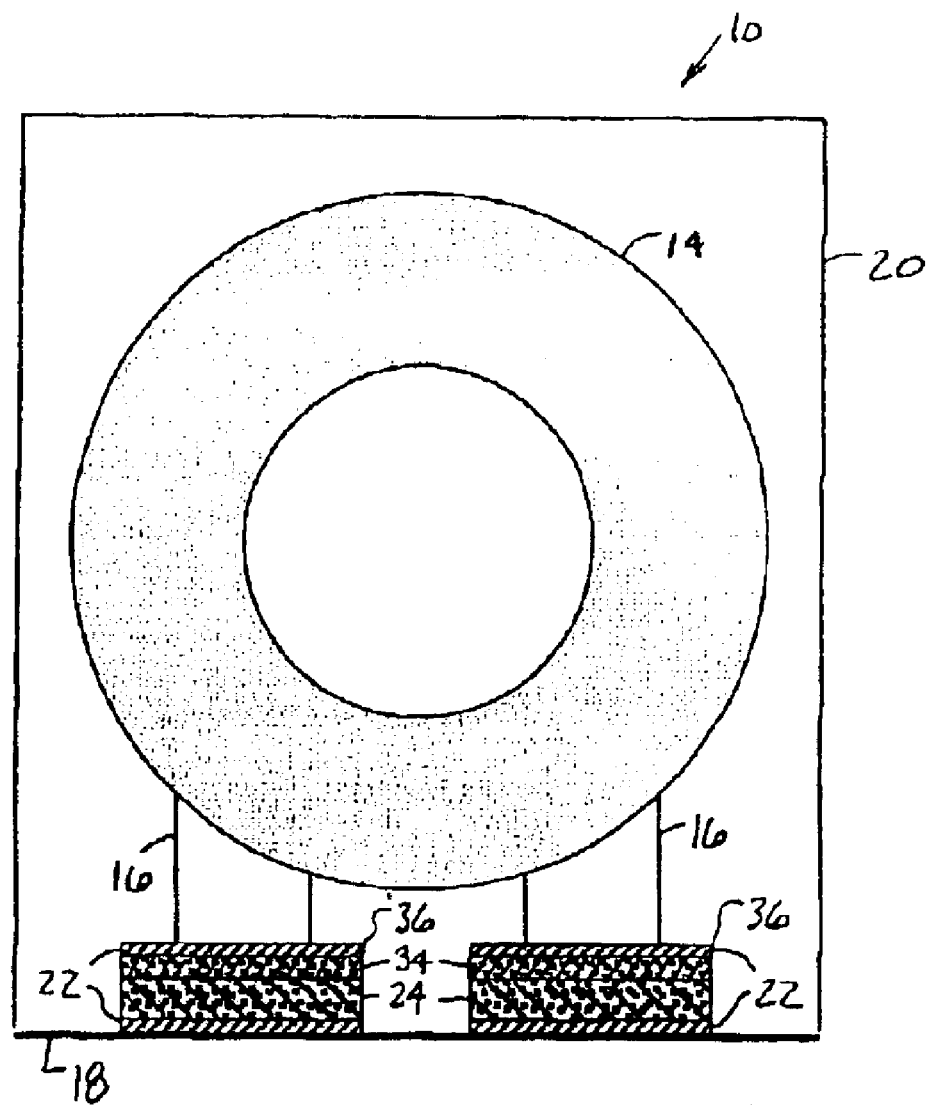
FIG. 4 is a front view of a MR imaging system utilizing an MR system isolation impedance mismatch apparatus in accordance with another embodiment of the present invention.

Referring now also to FIG. 4, a front view of a MR imaging system 10" utilizing a MR system isolation impedance mismatch apparatus in accordance with another embodiment of the present invention is shown. In step 116B, when a fine adjustment is performed, a second set of or additional impedance mismatch layers 34 are installed in addition to the first impedance mismatch layers 24 to form second impedance mismatch apparatuses 36. For example, the second impedance mismatch layer 34 may be formed of a closed cell elastomeric material and may be coupled to the first impedance mismatch layer 24 that is formed of an open celled elastomer. The second impedance mismatch layer 34 has a second stiffness rating that is less than that of the first stiffness rating to decrease overall stiffness of the apparatuses 36.

In step 118, resulting impedance mismatch layers from step 116A and 116B attenuate a set of mechanical and acoustical vibrations generated from the MR systems 10 and 10" and prevent amplification of a set of mechanical rigid body vibrations from surrounding structures.

The above-described steps are meant to be an illustrative example; the steps may be performed synchronously, sequentially, simultaneously, or in a different order depending upon the application. Also, the above provided values, such as the operating frequency ranges, are intended only for explanation purposes and are not meant to be limiting.

The present invention provides an apparatus and system for isolating mechanical vibrational disturbances between an MR imaging system and a surrounding structure, and a method of tuning the same. The apparatus provide an impedance mismatch between MR imaging system components and surrounding structures, thus not only attenuating vibrational frequencies generated by the MR system components but also preventing amplification of rigid body motion contained within the surrounding structures. In so doing, the present invention potentially improves MR system image quality. The apparatus is also versatile in that it may be applied in multiple applications, attenuate multiple and various frequency ranges, and is easily tunable for various current applications as well as for future MR system updates.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. An MR system isolation impedance mismatch apparatus comprising at least one impedance mismatch layer performing as a mechanical notch filter and isolating at least one MR system component from at least one surrounding structure.

2. An apparatus as in claim 1 wherein said at least one impedance mismatch layer comprises a geometry pattern that is different than that of said at least one MR system component and said surrounding structure.

3. An apparatus as in claim 1 wherein said at least one impedance mismatch layer comprises a plurality of apertures.

4. An apparatus as in claim 1 wherein said at least one impedance mismatch layer is sized in response to gross weight of said at least one MR component.

5. An apparatus as in claim 1 wherein said at least one impedance mismatch layer is formed of an elastomeric material.

6. An apparatus as in claim 1 wherein said at least one impedance mismatch layer is formed of rubber.

7. An apparatus as in claim 1 wherein said at least one impedance mismatch layer comprises a weave of material.

8. An apparatus as in claim 1 further comprising at least one rigid plate coupled to said at least one impedance mismatch layer and between said at least one MR system component and said surrounding structure.

9. An apparatus as in claim 8 wherein said at least one rigid plate is formed of a material selected from at least one of metal, plastic, ceramic, and porcelain.

10. An apparatus as in claim 1 further comprising:
a first rigid plate mechanically coupled between said at least one MR system component and said at least one impedance mismatch layer; and
a second rigid plate mechanically coupled between said at least one impedance mismatch layer and said at least one surrounding structure.

11. An apparatus as in claim 1 wherein said at least one impedance mismatch layer has substantially different impedance than said at least one surrounding structure and is tuned to attenuate vibrations generated from said at least one MR system component and to prevent amplification of vibrations generated from said at least one surrounding structure.

12. An isolated MR system comprising:
at least one MR system component; at least one surrounding structure proximate said at least one MR system component; and
an MR system isolation impedance mismatch apparatus mechanically coupled between said at least one MR system component and said surrounding structure and comprising at least one impedance mismatch layer performing as a mechanical notch filter and isolating said at least one MR system component from said at least one surrounding structure.

13. A system as in claim 12 wherein said at least one MR system component generates a first set of vibrations and said at least one surrounding structure generates a second set of vibrations and said at least one impedance mismatch layer isolates said first set of vibrations from said second set of vibrations.

14. A system as in claim 13 wherein said at least one impedance mismatch layer attenuates said first set of vibrations and prevents amplification of said second set of vibrations.

15. A system as in claim 14 wherein said at least one impedance mismatch layer has a material pattern different than that of the first rigid plate and the second rigid plate and comprises a plurality of apertures.

16. A method of tuning an MR system isolation impedance mismatch apparatus comprising:
determining a default notch filter frequency range; forming a first MR system isolation impedance mismatch apparatus to perform as a notch filter having said default notch filter frequency range;

installing and test said first MR system isolation impedance mismatch apparatus between at least one MR system component and at least one surrounding structure;

detecting vibrations in said at least one MR system component and in said at least one surrounding structure; and adjusting said first MR system isolation impedance mismatch apparatus in response to said detected vibrations.

17. A method as in claim 16 wherein adjusting said first MR system isolation impedance mismatch apparatus comprises performing a coarse adjustment by replacing said first MR system isolation impedance mismatch apparatus with a second MR system isolation impedance mismatch apparatus that has a notch filter frequency range that is different than that of the first MR system isolation impedance mismatch apparatus.

18. A method as in claim 16 wherein determine a default notch filter frequency range comprises:

determining a first vibrational frequency range corresponding to vibrations generated by said at least one MR system component; and determining a second vibrational frequency range corresponding to vibrations generated by said at least one surrounding component.

19. A method as in claim 18 wherein forming said first MR system isolation impedance mismatch apparatus is performed in response to said first vibrational frequency range and said second vibrational frequency range.

20. A method as in claim 16 wherein adjusting said first MR system isolation impedance mismatch apparatus comprises performing a fine adjustment by installing an additional MR system isolation impedance mismatch apparatus.

* * * * *